(12) United States Patent
Lin et al.

(10) Patent No.: US 11,264,447 B2
(45) Date of Patent: Mar. 1, 2022

(54) TOUCH DISPLAY DEVICE

(71) Applicant: Au Optronics Corporation, Hsinchu (TW)

(72) Inventors: Kung-Cheng Lin, Hsinchu (TW); Pin-Miao Liu, Hsinchu (TW); Ting-Yu Hsu, Hsinchu (TW); Chia-Kai Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 114 days.

(21) Appl. No.: 16/897,257

(22) Filed: Jun. 9, 2020

(65) Prior Publication Data

US 2021/0028268 A1 Jan. 28, 2021

Related U.S. Application Data

(60) Provisional application No. 62/878,889, filed on Jul. 26, 2019.

(30) Foreign Application Priority Data

Mar. 30, 2020 (TW) ................. 109110776

(51) Int. Cl.
*H01L 27/32* (2006.01)
*H01L 51/00* (2006.01)
*H01L 51/52* (2006.01)

(52) U.S. Cl.
CPC ........ *H01L 27/3276* (2013.01); *H01L 27/323* (2013.01); *H01L 27/3258* (2013.01);
(Continued)

(58) Field of Classification Search
CPC ............... H01L 27/3276; H01L 27/323; H01L 27/3258; H01L 51/0097; H01L 51/5256;
(Continued)

(56) References Cited

U.S. PATENT DOCUMENTS 10,429,986 B2   10/2019  Kim et al.
2017/0090661 A1*  3/2017  Kim .................... H01L 27/3276
(Continued)

FOREIGN PATENT DOCUMENTS

CN     107025014     8/2017
CN     108155219     6/2018
(Continued)

*Primary Examiner* — Kyoung Lee
(74) *Attorney, Agent, or Firm* — JCIPRNET

(57) ABSTRACT

A touch display device includes a first substrate and a second substrate. The first substrate has a signal wire and a display unit which are electrically connected to each other. The second substrate has a conductive circuit and a touch unit which are disposed on one side of the second substrate facing the first substrate. The second substrate includes a touch area and a bending area, the touch unit is disposed in the touch area, and the touch area is stacked on the display unit, and the conductive circuit is disposed in the bending area and is electrically connected to the signal wire. The bending area extends from an edge of the first substrate and is bent to one side of the first substrate facing away from the second substrate.

10 Claims, 8 Drawing Sheets

(52) U.S. Cl.
CPC ...... *H01L 51/0097* (2013.01); *H01L 51/5256* (2013.01); *H01L 2251/5338* (2013.01)

(58) Field of Classification Search
CPC ... H01L 2251/5338; G06F 2203/04102; G06F 2203/04103; G06F 3/0445; G06F 3/0412; Y02E 10/549
See application file for complete search history.

(56) References Cited

U.S. PATENT DOCUMENTS

| | | |
|---|---|---|
| 2019/0206968 A1 | 7/2019 | Yang et al. |
| 2020/0201392 A1 | 6/2020 | Yu et al. |

FOREIGN PATENT DOCUMENTS

| | | |
|---|---|---|
| CN | 109273411 | 1/2019 |
| CN | 109658831 | 4/2019 |
| CN | 109994606 | 7/2019 |

\* cited by examiner

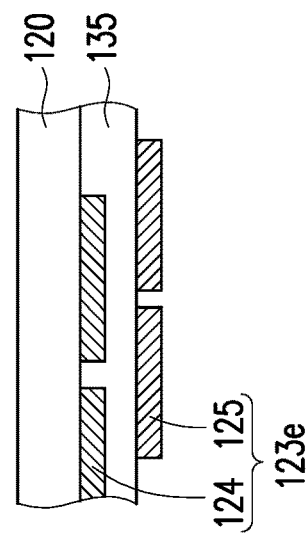
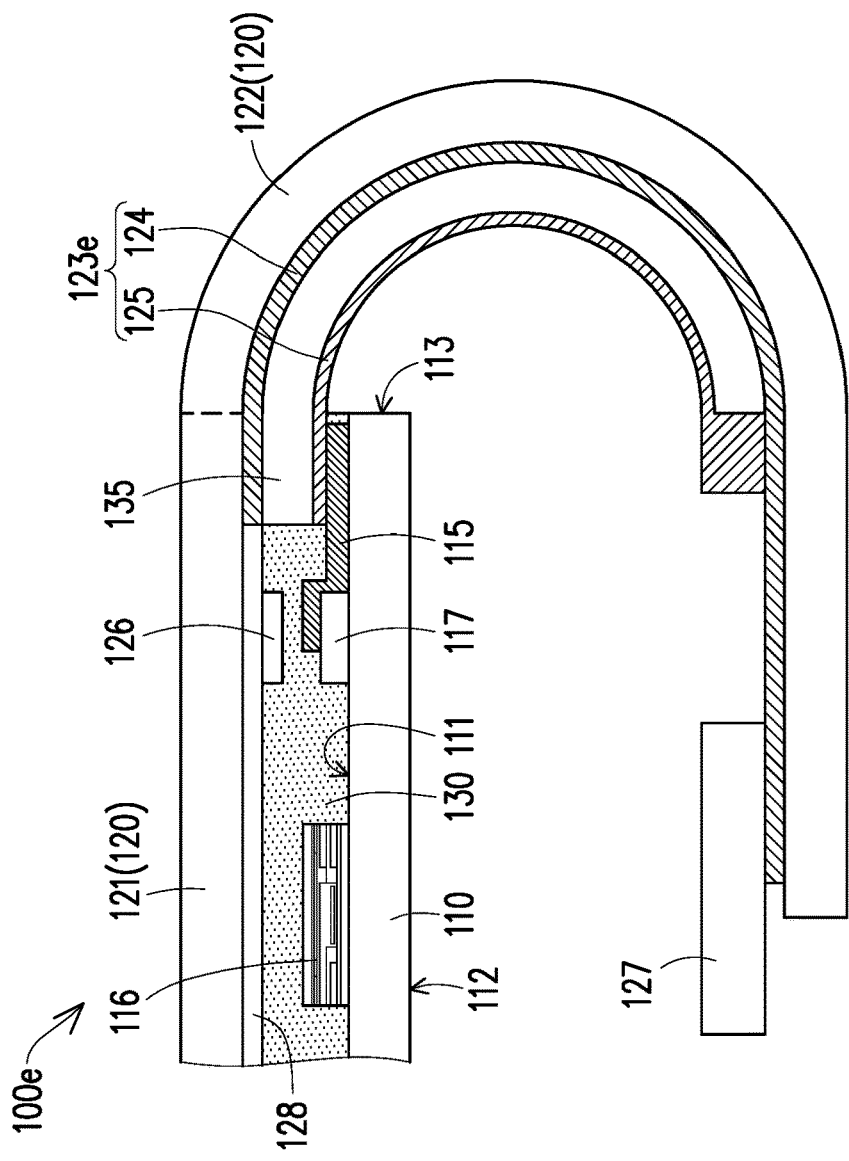
FIG. 8
FIG. 7

TOUCH DISPLAY DEVICE

CROSS-REFERENCE TO RELATED APPLICATION

This application claims the priority benefits of U.S. provisional application Ser. No. 62/878,889, filed on Jul. 26, 2019, and Taiwan application serial no. 109110776, filed on Mar. 30, 2020. The entirety of each of the above-mentioned patent applications is hereby incorporated by reference here and made a part of this specification.

BACKGROUND

Technical Field

The disclosure relates to a display apparatus, and in particular to a touch display device.

Description of Related Art

In order to achieve a slim border effect, circuits extending beyond a touch surface of the existing touch display device are bent to the bottom of the touch display device; however, such design may cause product failure because the bent circuits are subject to tensile stress and may be easily broken.

SUMMARY

The disclosure provides a touch display device to better prevent the bent circuits from being broken.

In an embodiment of the disclosure, a touch display device including a first substrate and a second substrate is provided. The first substrate has a signal wire and a display unit which are electrically connected to each other. The first substrate has a first surface and a second surface opposite to each other. The second substrate has a conductive circuit and a touch unit which are disposed on one side of the second substrate facing the first substrate. The second substrate includes a touch area and a bending area, the touch unit is disposed in the touch area, and the touch area is stacked on the display unit. The conductive circuit is disposed in the bending area and is electrically connected to the signal wire. The bending area extends from an edge of the first substrate and is bent to one side of the first substrate facing away from the second substrate.

According to an embodiment of the disclosure, the second substrate has a driver chip that is located on the one side of the second substrate facing the second surface of the first substrate, and the driver chip is electrically connected to the conductive circuit.

According to an embodiment of the disclosure, an insulation layer is filled between the touch area of the second substrate and the first surface of the first substrate, and a conducting member penetrates the insulation layer and is connected to the conductive circuit and the signal wire.

According to an embodiment of the disclosure, an insulation layer is filled between the touch area of the second substrate and the first surface of the first substrate, and a conducting member extends along an edge of the insulation layer and is connected to the conductive circuit and the signal wire.

According to an embodiment of the disclosure, the first substrate has a chamfer or a rounded corner at a junction of the first surface and the edge of the first substrate.

According to an embodiment of the disclosure, the second substrate further includes an anti-glare structure, a polarizing structure, or an anti-smudge protective film disposed in the touch area.

According to an embodiment of the disclosure, the second substrate further includes a color resist filter layer disposed in the touch area.

According to an embodiment of the disclosure, the conductive circuit includes a single-layer circuit layer.

According to an embodiment of the disclosure, the conductive circuit includes a first circuit layer and a second circuit layer that are located on different planes and electrically connected to each other, and projections of the first circuit layer and the second circuit layer on the second substrate do not overlap.

According to an embodiment of the disclosure, the conductive circuit includes a first circuit layer and a second circuit layer located on different planes and electrically connected to each other, and projections of the first circuit layer and the second circuit layer on the second substrate partially overlap.

Based on the above, in the touch display device provided in one or more embodiments of the disclosure, the signal wire of the display unit on the first substrate and the conductive circuit on the second substrate are electrically connected. Signals of the display unit on the first substrate may be transmitted through the conductive circuit in the bending area of the second substrate, and the first substrate does not require any bent section. In addition, the conductive circuit is disposed on the side of the second substrate facing the first substrate, i.e., located at an inner surface of the bending area, the conductive circuit in the bending area is not subject to tensile stress because the conductive circuit is located on the inside of a stress neutral plane formed during the bending operation. Therefore, the touch display device provided herein may effectively prevent the conductive circuit in the bending region from being broken.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 7 is a schematic cross-sectional view illustrating that a touch display device is already bent in a bending area according to another embodiment of the disclosure.

FIG. 8 is a schematic cross-sectional view illustrating a portion of the second substrate depicted in FIG. 7 in the bending area.

DESCRIPTION OF THE EMBODIMENTS

Figure 1:
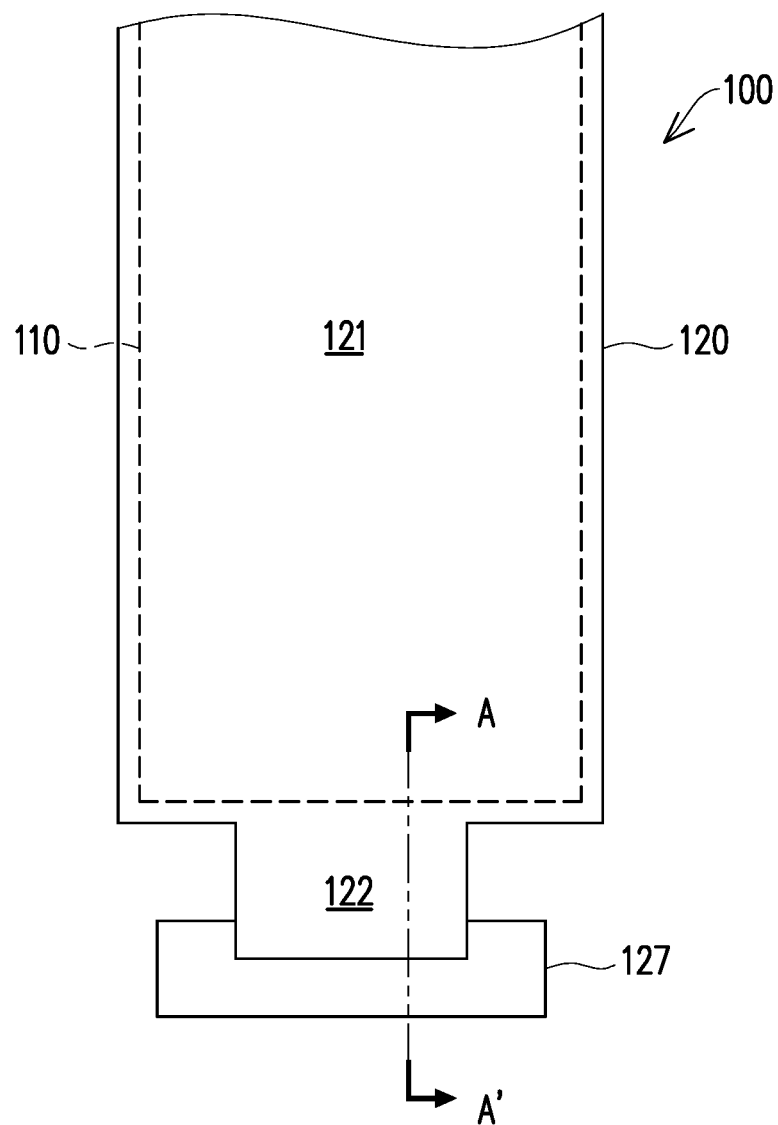
FIG. 1 is a schematic view illustrating that a second substrate of a touch display device has not yet been bent according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
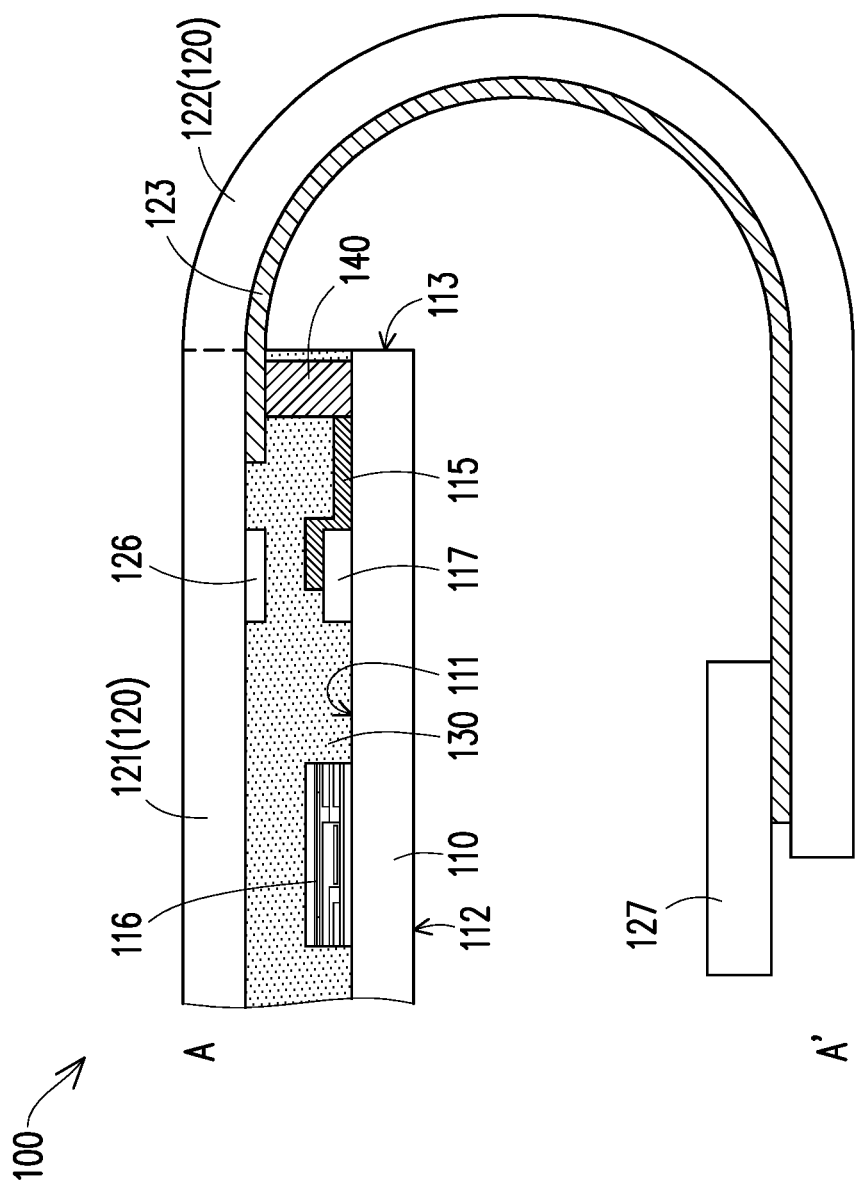
FIG. 2 is a schematic cross-sectional view illustrating that the touch display device in FIG. 1 is already bent in the bending area.

FIG. 1 is a schematic view illustrating that a second substrate of a touch display device has not yet been bent according to an embodiment of the disclosure. FIG. 2 is a schematic cross-sectional view illustrating that the touch display device in FIG. 1 is already bent in the bending area. It should be mentioned that FIG. 2 is a cross-sectional view illustrating that a bending area 122 of the second substrate 120 in FIG. 1 is already bent toward the bottom of a touch area 121.

With reference to FIG. 2, a touch display device 100 provided in the embodiment includes a first substrate 110 and a second substrate 120. The first substrate 110 has a signal wire 115 and a display unit 116, and the display unit 116 and the signal wire 115 are electrically connected. The display unit 116 includes a light-emitting element (with no reference number) and is connected to the driver device 117. The signal wire 115 may be a signal supply line electrically connected to the driver device 117.

The second substrate 120 has a conductive circuit 123 and a touch unit 126. The touch unit 126 and the conductive circuit 123 are disposed on one side of the second substrate 120 facing the first substrate 110. In the embodiment, the second substrate 120 includes the touch area 121 and the bending area 122. The touch unit 126 is disposed in the touch area 121, and the touch area 121 is stacked on the display unit 116. In the embodiment, the conductive circuit 123 includes a single-layer circuit layer, but the form of the conductive circuit 123 is not limited thereto. The conductive circuit 123 is disposed in the bending area 122 and is electrically connected to the signal wire 115.

In the embodiment, an insulation layer 130 is filled between the touch area 121 of the second substrate 120 and a first surface 111 of the first substrate 110, and a conducting member 140 penetrates the insulation layer 130 and is connected to the conductive circuit 123 and the signal wire 115.

In addition, as shown in FIG. 2, the second substrate 120 provided in the embodiment has a driver chip 127 that is located on the side of the second surface 120 facing a second surface 112 of the first substrate 110, and the driver chip 127 is electrically connected to the conductive circuit 123. Therefore, the driver chip 127 may be electrically connected to the display unit 116 through the conductive circuit 123, the conducting member 140, and the signal wire 115.

It is worth mentioning that the bending area 122 extends from an edge of the first substrate 110 and bends to one side of the first substrate 110 facing away from the second substrate 120. As shown in FIG. 2, a portion of the bending area 122 of the second substrate 120 closer to the touch area 121 (i.e., the arc-shaped portion of the bending area 122 in FIG. 2) and the first substrate 110 does not overlap, while another portion of the bending area 122 of the second substrate 120 farther from the touch area 121 (i.e., the flat portion of the bending area 122 in FIG. 2) and the first substrate 110 overlap.

In the embodiment, the touch area 121 of the second substrate 120 of the touch display device 100 is stacked on the display unit 116 on the first substrate 110, the conductive circuit 123 is disposed in the bending area 122 of the second substrate 120, and the bending area 122 extends from the edge of the first substrate 110 and is bent to one side of the first substrate 110 opposite to the second substrate 120. The design of reversely folding the bending area 122 where the conductive circuit 123 is disposed in the second substrate 120 allows the touch display device 100 to achieve the slim border effect.

In addition, the signal wire 115 of the display unit 116 on the first substrate 110 and the conductive circuit 123 on the second substrate 120 are electrically connected. Signals of the display unit 116 on the first substrate 110 may be transmitted through the conductive circuit 123 located on the bending area 122 of the second substrate 120. Therefore, as shown in FIG. 2, the first substrate 110 may not require any bent section.

In addition, in the embodiment, the conductive circuit 123 is disposed on one side of the second substrate 120 facing the first substrate 110, i.e., located at an inner surface of the bending area 122. A distance between the arc-shaped stress neutral plane (around the center of the bending area 122 in the thickness direction) of the bending area 122 of the second substrate 120 and an outer surface of the bending area 122 is approximately close to a distance between the arc-shaped stress neutral plane and the inner surface of the bending area 122. Therefore, said design allows the conductive circuit 123 on the bending area 122 to be located on the inside of the stress neutral plane of the bending area 122 without being subject to tensile stress. As such, the touch display device 100 may effectively prevent the conductive circuit 123 on the bending area 122 from being broken.

Figure 3:
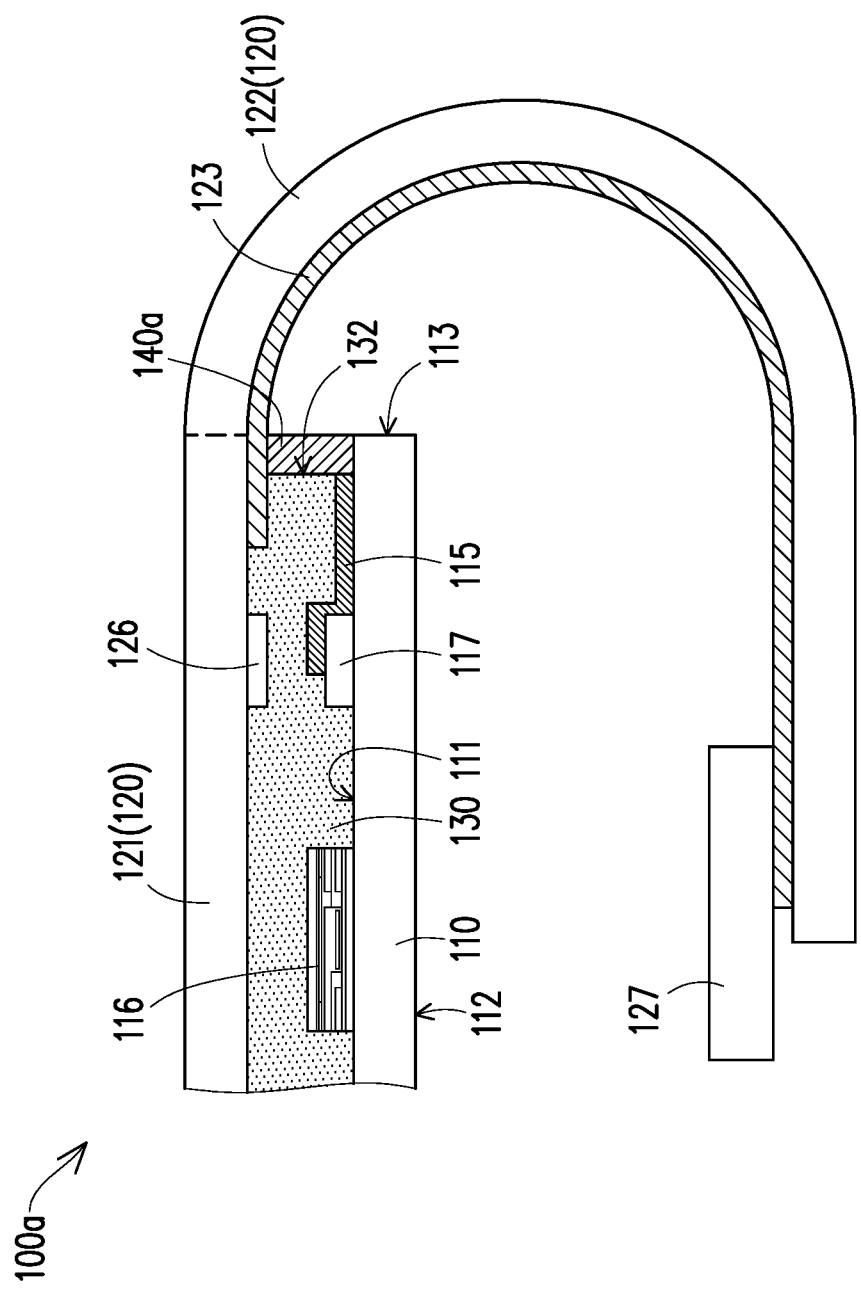
FIG. 3 is a schematic cross-sectional view illustrating that a touch display device is already bent in a bending area according to another embodiment of the disclosure.

FIG. 3 is a schematic cross-sectional view illustrating that a touch display device is already bent in a bending area according to another embodiment of the disclosure. With reference to FIG. 3, the main difference between the touch display device 100a in FIG. 3 and the touch display device 100 in FIG. 2 lies in that the conducting member 140 in FIG. 2 penetrates the insulation layer 130 to be connected to the conductive circuit 123 and the signal wire, while in the embodiment the conducting member 140a extends along an edge 132 of the insulation layer 130 to be connected to the conductive circuit 123 and the signal wire 115.

Figure 4:
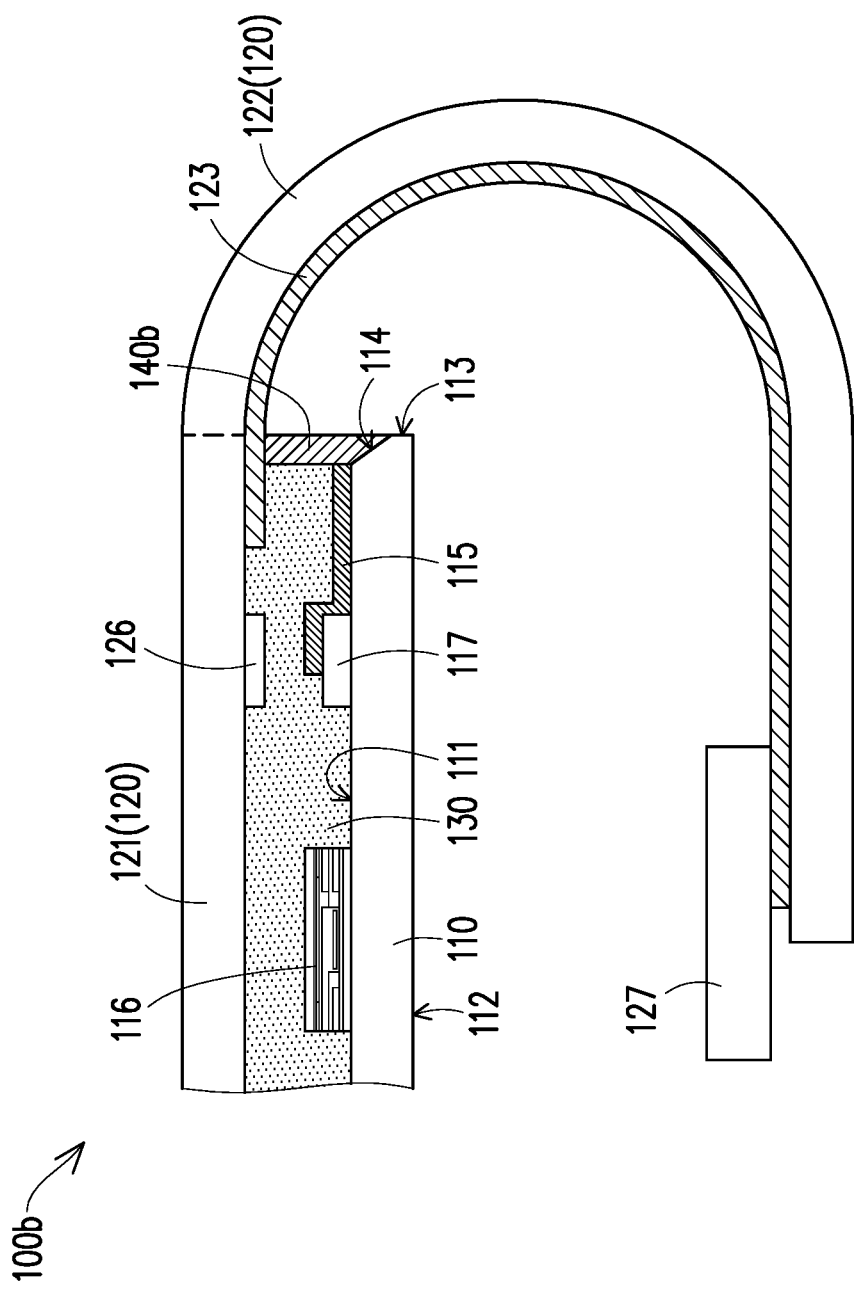
FIG. 4 is a schematic cross-sectional view illustrating that a touch display device is already bent in a bending area according to another embodiment of the disclosure.

FIG. 4 is a schematic cross-sectional view illustrating that a touch display device is already bent in a bending area according to another embodiment of the disclosure. With reference to FIG. 4, the main difference between the touch display device 100b in FIG. 4 and the touch display device 100a in FIG. 3 lies in that the first substrate 110 in the embodiment has a chamfer 114 at a junction between the first surface 111 and an edge 113 of the first substrate 110. The design of the chamfer 114 ensures that no sharp corner is at the junction between the first surface 111 and the edge 113, so as to better prevent the signal wire 115 and the conducting member 140b approaching the edge 113 from being damaged. In other embodiments, there may be a rounded corner at the junction between the first surface 111 of the first substrate 110 and the edge 113, which should however not be construed as being limited to what is illustrated in the drawings.

Figure 5:
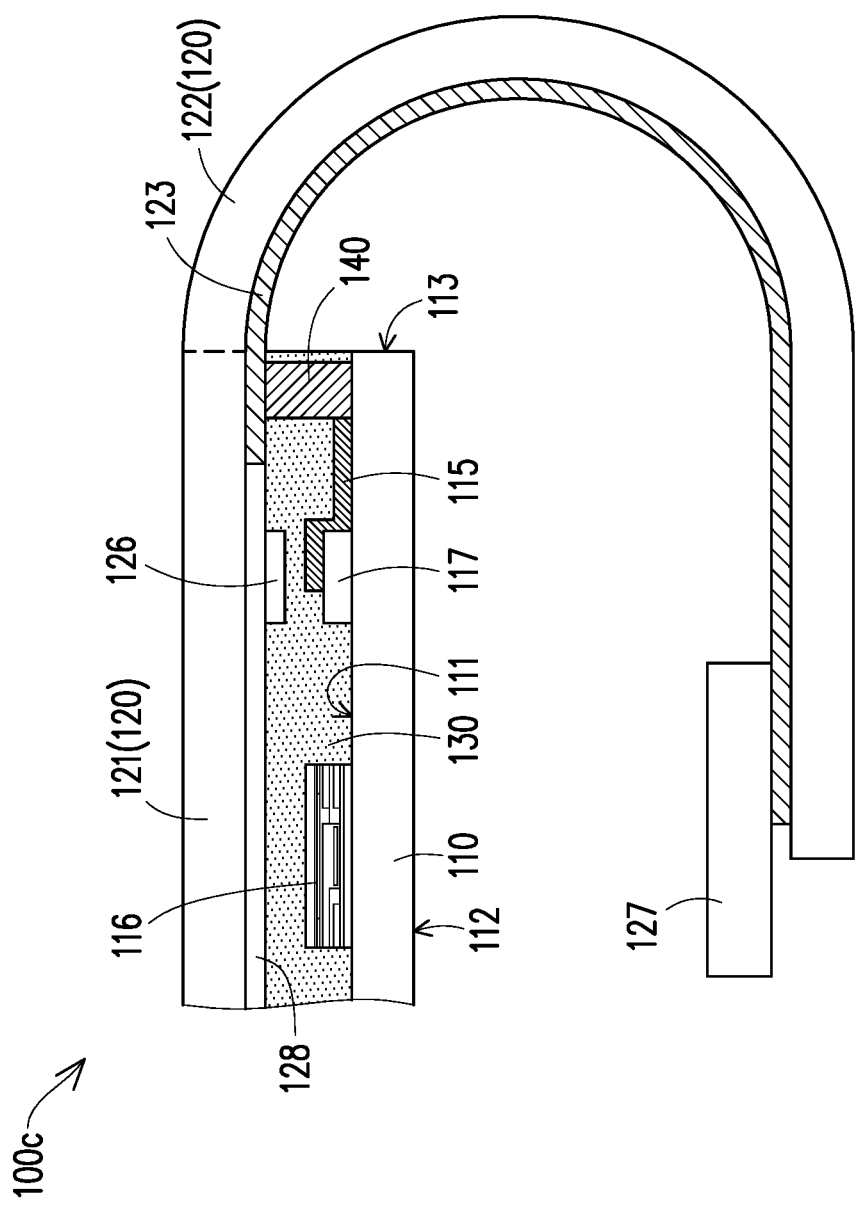
FIG. 5 is a schematic cross-sectional view illustrating that a touch display device is already bent in a bending area according to another embodiment of the disclosure.

FIG. 5 is a schematic cross-sectional view illustrating that a touch display device is already bent in a bending area according to another embodiment of the disclosure. With reference to FIG. 5, the main difference between the touch display device 100c in FIG. 5 and the touch display device 100 in FIG. 2 lies in that the second substrate 120 in the embodiment further includes an anti-glare structure 128 disposed in the touch area 121. The anti-glare structure 128 may be located between the second substrate 120 and the insulation layer 130 and may serve to reduce the reflection caused by ambient light when a user looks directly at the display area.

In other embodiments, the second substrate 120 may also include a polarizing structure (not shown) disposed in the touch area 121. The polarizing structure may be located between the second substrate 120 and the insulation layer 130. The polarizing light structure may also serve to reduce the reflection caused by ambient light when the user looks directly at the display area.

Alternatively, in other embodiments, the second substrate 120 may also include an anti-smudge protective film (not shown) disposed in the touch area 121. The anti-smudge protective film may be located on the display area on the side of the second substrate 120 away from the first substrate 110. The anti-smudge protective film may serve to prevent scratches or impacts on the surface, leaving traces that affect the display image.

Figure 6:
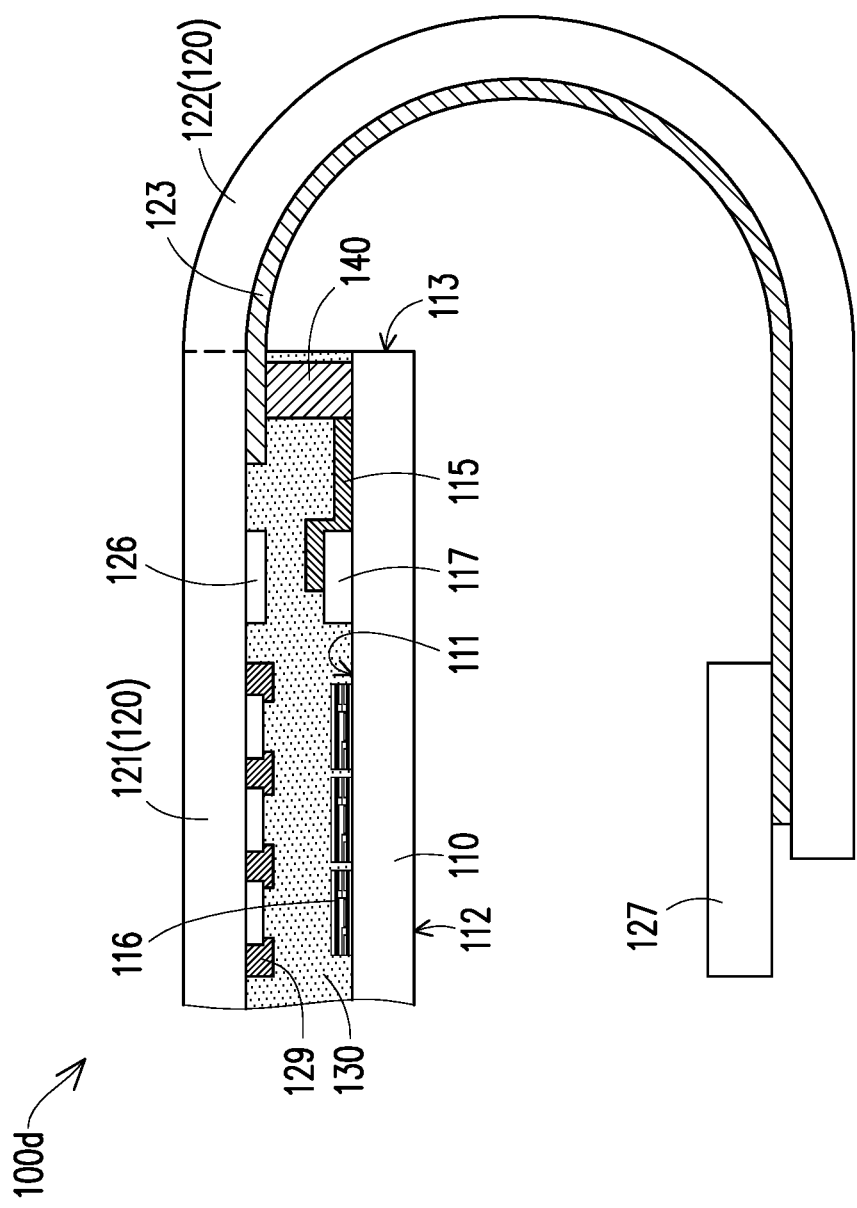
FIG. 6 is a schematic cross-sectional view illustrating that a touch display device is already bent in a bending area according to another embodiment of the disclosure.

FIG. 6 is a schematic cross-sectional view illustrating that a touch display device is already bent in a bending area according to another embodiment of the disclosure. With reference to FIG. 6, the main difference between the touch display device 100d in FIG. 6 and the touch display device 100 in FIG. 2 lies in that the second substrate 120 in the embodiment further includes a color resist filter layer 129 disposed in the touch area 121. The color resist filter layer 129 may be located between the second substrate 120 and the insulation layer 130. The color resist filter layer 129 may serve to improve the quality of the display image.

FIG. 7 is a schematic cross-sectional view illustrating that a touch display device is already bent in a bending area according to another embodiment of the disclosure. FIG. 8 is a schematic cross-sectional view illustrating a portion of the second substrate depicted in FIG. 7 in the bending area. With reference to FIG. 7 and FIG. 8, the main difference between the touch display device 100e in FIG. 7 and the touch display device 100 in FIG. 2 lies in that the conductive circuit 123e in the embodiment includes a first circuit layer 124 and a second circuit layer 125 located on different planes and electrically connected to each other. The first circuit layer 124 and the second circuit layer 125 are separated by an insulation layer 135. As shown in FIG. 8, projections of the first circuit layer 124 and the second circuit layer 125 on the second substrate 120 partially overlap.

Figure 10:
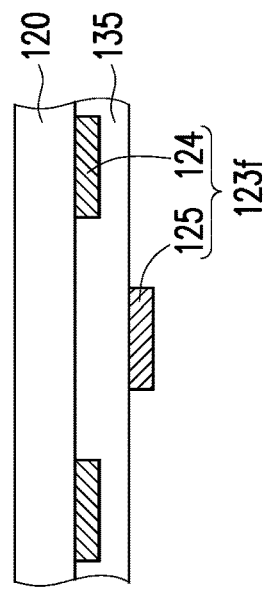
FIG. 10 is a schematic cross-sectional view illustrating a portion of the second substrate depicted in FIG. 9 in the bending area.
Figure 9:
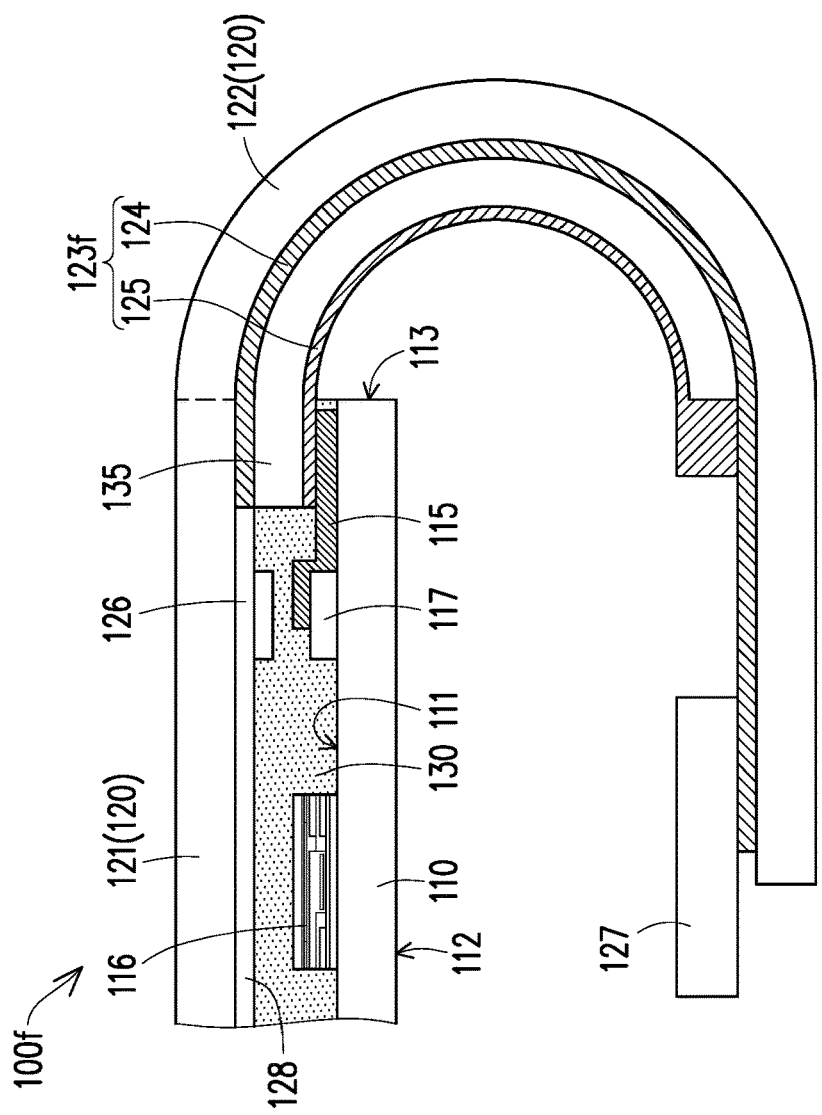
FIG. 9 is a schematic cross-sectional view illustrating that a touch display device is already bent in a bending area according to another embodiment of the disclosure.

FIG. 9 is a schematic cross-sectional view illustrating that a touch display device is already bent in a bending area according to another embodiment of the disclosure. FIG. 10 is a schematic cross-sectional view illustrating a portion of the second substrate depicted in FIG. 9 in the bending area. With reference to FIG. 9 and FIG. 10, after comparing FIG. 10 and FIG. 8, it can be learned that the projections of the first circuit layer 124 and the second circuit layer 125 of the conductive circuit 123f on the second substrate 120 do not overlap.

To sum up, in the touch display device provided in one or more embodiments of the disclosure, the signal wire of the display unit on the first substrate is electrically connected to the conductive circuit on the second substrate. The signal of the display unit on the first substrate may be transmitted through the conductive circuit on the bending area of the second substrate. The first substrate does not require any bent section. In addition, the conductive circuit is disposed one the side of the second substrate facing the first substrate, i.e., the inner surface of the bending area. Said design ensures that the conductive circuit in the bending area is not subject to tensile stress because the conductive circuit is located on the inside of the stress neutral plane formed during the bending operation. Therefore, the touch display device provided herein may effectively prevent the conductive circuit in the bending region from being broken.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A touch display device, comprising:
   a first substrate, having a signal wire and a display unit, the display unit and the signal wire being electrically connected to each other, the first substrate having a first surface and a second surface opposite to each other;
   a second substrate, having a conductive circuit and a touch unit, wherein the touch unit and the conductive circuit are disposed on one side of the second substrate facing the first substrate, the second substrate comprises a touch area and a bending area, the touch unit is disposed in the touch area, the touch area is stacked on the display unit, the conductive circuit is disposed in the bending area and is electrically connected to the signal wire, and
   the bending area extends from an edge of the first substrate and is bent to one side of the first substrate facing away from the second substrate.

2. The touch display device according to claim 1, wherein the second substrate has a driver chip located on the one side of the second substrate facing the second surface of the first substrate, and the driver chip is electrically connected to the conductive circuit.

3. The touch display device according to claim 1, wherein an insulation layer is filled between the touch area of the second substrate and the first surface of the first substrate, and a conducting member penetrates the insulation layer and is connected to the conductive circuit and the signal wire.

4. The touch display device according to claim 1, wherein an insulation layer is filled between the touch area of the second substrate and the first surface of the first substrate, and a conducting member extends along an edge of the insulation layer and is connected to the conductive circuit and the signal wire.

5. The touch display device according to claim 4, wherein the first substrate has a chamfer or a rounded corner at a junction of the first surface and the edge of the first substrate.

6. The touch display device according to claim 1, wherein the second substrate further comprises an anti-glare structure, a polarizing structure, or an anti-smudge protective film disposed in the touch area.

7. The touch display device according to claim 1, wherein the second substrate further comprises a color resist filter layer disposed in the touch area.

8. The touch display device according to claim 1, wherein the conductive circuit comprises a single-layer circuit layer.

9. The touch display device according to claim 1, wherein the conductive circuit comprises a first circuit layer and a second circuit layer located on different planes and electrically connected to each other, and projections of the first circuit layer and the second circuit layer on the second substrate do not overlap.

10. The touch display device according to claim 1, wherein the conductive circuit comprises a first circuit layer and a second circuit layer located on different planes and electrically connected to each other, and projections of the first circuit layer and the second circuit layer on the second substrate partially overlap.

\* \* \* \* \*